(12) United States Patent
Lin et al.

(10) Patent No.: US 10,711,188 B2
(45) Date of Patent: Jul. 14, 2020

(54) PROCESS FOR PRODUCING QUANTUM DOTS HAVING BROADENED OPTICAL EMISSION

(71) Applicant: Raytheon Company, Waltham, MA (US)

(72) Inventors: Stephanie J. Lin, Redondo Beach, CA (US); James R. Chow, San Gabriel, CA (US); Kalin Spariosu, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 334 days.

(21) Appl. No.: 15/711,180

(22) Filed: Sep. 21, 2017

(65) Prior Publication Data

US 2019/0085238 A1    Mar. 21, 2019

(51) Int. Cl.
*C09K 11/66*    (2006.01)
*H01L 33/50*    (2010.01)
(Continued)

(52) U.S. Cl.
CPC ............ *C09K 11/662* (2013.01); *C01B 17/20* (2013.01); *C01B 19/007* (2013.01); *C01G 21/21* (2013.01); *C09K 11/025* (2013.01); *C09K 11/54* (2013.01); *C09K 11/565* (2013.01); *C09K 11/883* (2013.01); *F21K 9/64* (2016.08); *F21V 7/22* (2013.01); *H01L 31/035218* (2013.01); *H01L 33/502* (2013.01); *B82Y 20/00* (2013.01); *B82Y 40/00* (2013.01); *C01P 2002/84* (2013.01); *C01P 2004/64* (2013.01); *C01P 2004/84* (2013.01); *C01P 2006/60* (2013.01); *F21Y 2115/10* (2016.08); *H01L 2933/0041* (2013.01);
(Continued)

(58) Field of Classification Search
CPC ........ C09K 11/663; B82Y 20/00; B82Y 40/00
See application file for complete search history.

(56) References Cited

U.S. PATENT DOCUMENTS 6,322,901 B1    11/2001  Bawendi et al.
6,344,272 B1    2/2002   Oldenburg et al.
(Continued)

FOREIGN PATENT DOCUMENTS

EP    2292718    *   3/2011

OTHER PUBLICATIONS

International Search Report and Written Opinion for corresponding International Application No. PCT/US2018/027427 dated Jul. 9, 2018.

*Primary Examiner* — C Melissa Koslow
(74) *Attorney, Agent, or Firm* — Renner, Otto, Boisselle & Sklar, LLP

(57) ABSTRACT

In certain embodiments, a first semiconductor material is vaporized to generate a vapor phase condensate. The vapor phase condensate is allowed to form nanoparticles. The nanoparticles are annealed to yield nanoparticles or cores. The cores are overcoated by introducing a solution containing second semiconductor material precursors in a coordinating solvent into a suspension of cores at a desired elevated temperature and mixing for a period of time sufficient to cause diffusion of the shell into the core. The diffusion of the shell into the core causes the quantum dots to exhibit a broadened optical emission. The produced quantum dots may be incorporated into a quantum dot based radiation source.

20 Claims, 3 Drawing Sheets

(51) Int. Cl.
  *F21K 9/64*      (2016.01)
  *F21V 7/22*      (2018.01)
  *C09K 11/54*     (2006.01)
  *C09K 11/88*     (2006.01)
  *C09K 11/02*     (2006.01)
  *C01B 17/20*     (2006.01)
  *C01B 19/00*     (2006.01)
  *C09K 11/56*     (2006.01)
  *C01G 21/21*     (2006.01)
  *H01L 31/0352*   (2006.01)
  *B82Y 20/00*     (2011.01)
  *F21Y 115/10*    (2016.01)
  *B82Y 40/00*     (2011.01)

(52) U.S. Cl.
  CPC ........ *Y10S 977/774* (2013.01); *Y10S 977/825* (2013.01); *Y10S 977/892* (2013.01); *Y10S 977/95* (2013.01)

(56) References Cited

U.S. PATENT DOCUMENTS

| | | |
|---|---|---|
| 6,501,091 B1 | 12/2002 | Bawendi et al. |
| 6,836,502 B2 | 12/2004 | Canady et al. |
| 7,326,908 B2 | 2/2008 | Sargent et al. |
| 8,350,223 B2 | 1/2013 | Mintz et al. |
| 8,790,440 B2 * | 7/2014 | Spariosu ............ B22F 9/12 264/12 |
| 9,199,842 B2 | 12/2015 | Dubrow et al. |
| 2014/0322373 A1 | 10/2014 | Spariosu |
| 2017/0162756 A1 | 6/2017 | Hartlove et al. |

* cited by examiner

PROCESS FOR PRODUCING QUANTUM DOTS HAVING BROADENED OPTICAL EMISSION

TECHNICAL FIELD

This invention relates generally to the field of particle formation and more specifically to a process for producing quantum dots having a broadened optical emission.

BACKGROUND

A quantum dot is a semiconductor with excitons that are confined in all three spatial dimensions. Quantum dots have properties that are between those of bulk semiconductors and those of discrete molecules. In certain embodiments, quantum dots may be used in active and/or passive electro optical (EO) devices such as detectors and lasers. Quantum dots may be fabricated in the visible, near infrared, mid-wavelength infrared (MWIR), and long wave infrared (LWIR) spectral ranges. Known methods for forming quantum dots may not be satisfactory in certain situations.

SUMMARY OF THE DISCLOSURE

In accordance with the present invention, disadvantages and problems associated with previous techniques for forming quantum dots may be reduced or eliminated.

In certain embodiments, a first semiconductor material is vaporized to generate a vapor phase condensate. The vapor phase condensate is allowed to form nanoparticles. The nanoparticles are annealed to yield nanoparticles or cores. The cores are overcoated by introducing a solution containing second semiconductor material precursors in a coordinating solvent into a suspension of cores at a desired elevated temperature and mixing for a period of time sufficient to cause diffusion of the shell into the core. The diffusion of the shell into the core causes the quantum dots to exhibit a broadened optical emission. The produced quantum dots may be incorporated into a quantum dot based radiation source.

Certain embodiments of the invention may provide one or more technical advantages. Conventionally, users desire quantum dots having discrete boundaries between the core and shell such that the dots exhibit a narrow range of emission for a specific application (e.g., light emitting diodes (LEDs)). To achieve a broadband multi-color emission, narrow band sources like LEDS may be packaged together but require many LEDs to form the whole band (0.8 micron to 1 micron). This results in larger subsystems which become difficult to package with the weight and volume constraints found on the next generation systems. Another conventional approach uses a mixture of quantum dots of different sizes.

A technical advantage of one embodiment of the invention may be the avoidance of larger subsystems and the need for large amounts of quantum dots by intentionally forcing diffusion of the shell into the core of the quantum dot (i.e., forcing degradation of the core/shell structure). This results in a broadening of the emission peak, which is desirable for a broadband emission source. The diffusion (i.e., the extent and shape of peak broadening) is controlled via elevated temperature and time adjustment.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1-6 of the drawings, like numerals being used for like.

Figure 1:
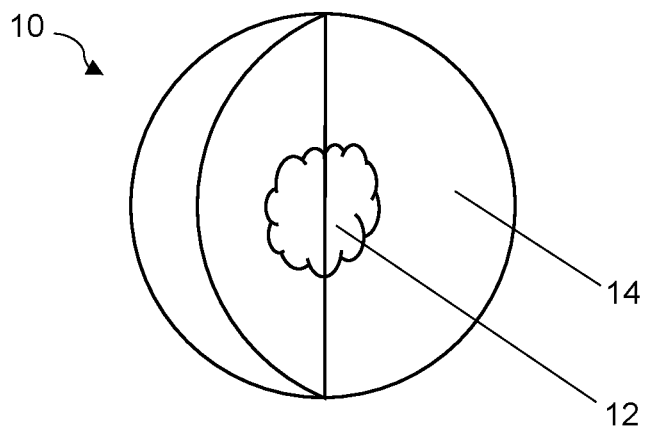
FIG. 1 illustrates an example of a quantum dot that may be formed according to the process of the invention.

FIG. 1 illustrates an example of a quantum dot 10 that may be prepared via processing that causes the quantum dot 10 to exhibit a broadened optical emission (described below). In the illustrated embodiment, the quantum dot 10 includes a core 12 comprising a first semiconductor material and a shell 14 comprising a second semiconductor material.

The first semiconductor material and the second semiconductor material may include InSb, PbTe, PbS, PbSe, HgTe, HgSe, CdTe, CdSe, CdS, and mixtures thereof. In a preferred embodiment, the first semiconductor material includes PbS, PbSe, PbTe, and mixtures thereof, and the second semiconductor material includes CdS, CdSe, CdTe, and mixtures thereof.

The quantum dots 10 may range in size from about 1 nm to about 10 nm with a particle size distribution of about 1% to about 10%. Although illustrated as being generally spherical, each quantum dot 10 may have any generally circular shape that allows the quantum dot to have a core/shell structure.

The quantum dots 10 may emit in a desired range of wavelengths, such as Visible (Vis) and IR including LWIR, MWIR and/or SWIR ranges. The quantum dots may have an emission range of 620 nm to 1 µm. As shown in Table 1 below, smaller particles have a higher peak emission than larger particles. Therefore, a distribution of sizes of the quantum dots 10 gives range and breadth of the emission peak.

TABLE 1

| Type | Surfactant | Core Diameter (nm) | Core + Shell diameter (nm) | Peak emission (nm) |
|---|---|---|---|---|
| CdSeTe/ZnS | Oleylamine | 6.4 | 8.2 | 800 |
| CdSeTe/ZnS | Oleylamine | 7.3 | 9.1 | 820 |

TABLE 1-continued

| Type | Surfactant | Core Diameter (nm) | Core + Shell diameter (nm) | Peak emission (nm) |
|---|---|---|---|---|
| CdSeTe/ZnS | Oleylamine | 8.2 | 10.0 | 840 |
| CdSeTe/ZnS | Oleylamine | 9.1 | 10.9 | 860 |
| CdSeTe/ZnS | Oleylamine | 10 | 11.8 | 880 |
| PbS/CdS | Oleic acid | 3.8 | 4.5 | 900 |
| PbS/CdS | Oleic acid | 4.0 | 4.7 | 920 |
| PbS/CdS | Oleic acid | 4.1 | 4.8 | 940 |
| PbS/CdS | Oleic acid | 4.2 | 4.9 | 960 |
| PbS/CdS | Oleic acid | 4.3 | 5.0 | 980 |
| PbS/CdS | Oleic acid | 4.4 | 5.1 | 1000 |

Figure 2:
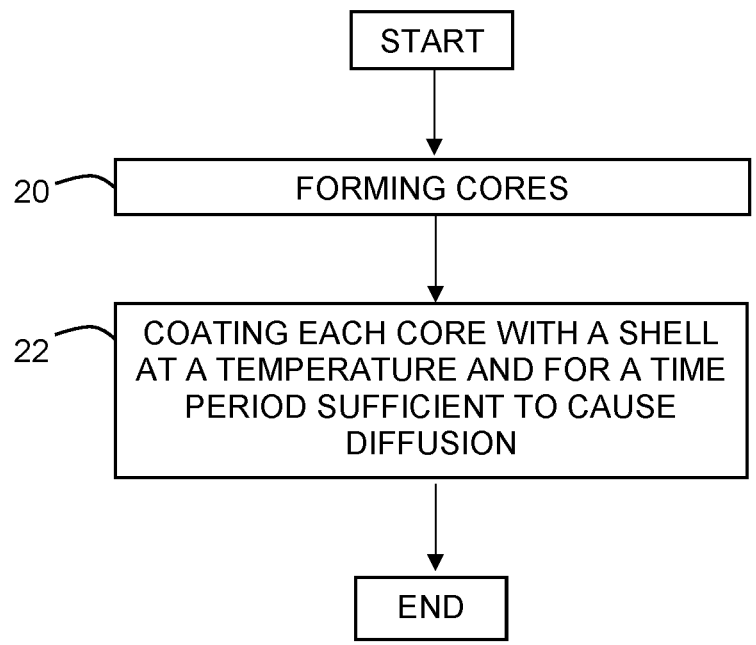
FIG. 2 illustrates an example of a process that may be used to produce quantum dots having broadened optical emission.

FIG. 2 illustrates an example process that may be used to form the quantum dot 10 (FIG. 1) having a broadened optical emission. A plurality of cores 12 (FIG. 1) including the first semiconductor material are formed at step 20.

Figure 3:
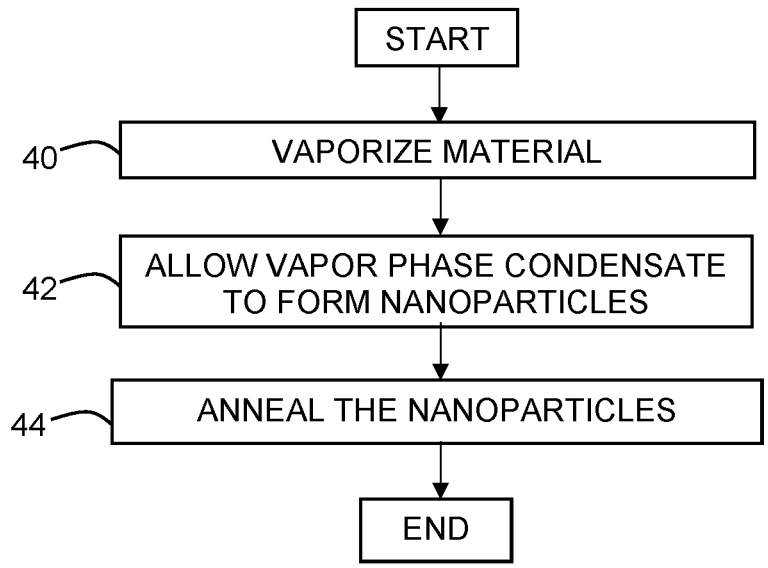
FIG. 3 illustrates an example of a method that may be used to form nanoparticles or cores.

FIG. 3 illustrates an example of a method that may be used to form the plurality of cores. First semiconductor material is vaporized at step 40 to generate a vapor phase condensate. The first semiconductor material may be vaporized by heating the first semiconductor material to a temperature greater than the boiling point of the first semiconductor material. The first semiconductor material may be heated until it is evaporated.

The vapor phase condensate may be allowed to form nanoparticles at step 42. After heating, individual atoms of the vapor may begin to cool and coalesce into droplets and/or particles. Nano-sized clusters of molecules undergo change of phase from gas to solid. The phase change may occur through reverse sublimation or phase condensation.

The nanoparticles are annealed at step 44 to yield cores. Annealing may involve heating the nanoparticles to a temperature greater than or equal to a re-crystallization temperature, maintaining the temperature, and then cooling the nanoparticles. For example, annealing may comprise heating the material to a temperature range of 200° C. to 300° C., 300° C. to 500° C., 500° C. to 700° C., or greater than 700° C., maintaining the temperature, and then cooling the material to a room temperature in a range of 20° C. to 30° C.

The step of forming the cores may include the steps of: (i) feeding the first semiconductor material onto a heater element to vaporize the material; (ii) allowing the vaporized material to flow upwardly from the heater element under free convection; (iii) injecting a quenchant gas upwardly from a position below the heater element, parallel to and into contact with the upward flow of the vaporized material and at the same speed as the vaporized material; (iv) allowing the quenchant gas and vaporized material to thermally interact to allow the material to condense out of the vapor to form a plurality of nanoparticles; and (v) annealing the nanoparticles to yield the plurality of cores.

Referring back to FIG. 2, at step 22, each core formed at step 20 is overcoated with a shell 14 (FIG. 1) to form quantum dots 10 (FIG. 1) having a broadened optical emission.

In one embodiment, the cores are overcoated using a collodial phase solution to form quantum dots. Specifically, the cores are overcoated by introducing a solution containing second semiconductor material precursors in a coordinating solvent (e.g., tri-n-octylphosphine) into a suspension of cores at the desired elevated temperature and mixing at this elevated temperature for a certain period of time. Controlling the temperature of the collodial phase solution and the time the cores are in the solution allows for alteration of the size and structure (i.e., amount of materials) of the quantum dots.

The mixture of the solution containing the second semiconductor material precursors in the coordinating solvent and the suspension of the cores may be heated to a temperature in the range of 135° C. to 220° C. Cores having a diameter in the range of about 2.3 nm 3.0 nm are overcoated at a temperature in the range of about 135-145° C., and preferably about 140° C. Similarly, cores having a diameter of about 3.5 nm, 4.0 nm, 4.8 nm, and 5.5 nm, respectively, are overcoated at a temperature of about 155-165° C., and preferably about 160° C., 175-185° C., and preferably about 180° C., about 195-205° C., and preferably about 200° C., and about 215-225° C., and preferably about 220° C., respectively.

The second semiconductor material precursor solution concentration and the rate of its addition to the cores is selected to promote heterogenous growth of the second semiconductor material onto the cores instead of a homogenous nucleation to produce second semiconductor material particles. Conditions favoring heterogenous growth include dropwise addition, e.g., 1-2 drops/second, of the second semiconductor material precursor solution to the core solution and maintenance of the second semiconductor material precursor solution at low concentrations. Low concentrations typically range from 0.0005-0.5 M.

After the addition of the second semiconductor material precursor solution to the core solution, the mixture may be left stirring for in the range of about 1 second to 120 seconds, or in another example, in the range of about 1 second to 60 seconds, or in another example, in the range of about 1 second to 30 seconds, or in another example, in the range of about 1 second to 10 seconds, or in another example, in the range of about 1 second to 5 seconds.

In some preferred embodiments, it may be desirable to include a final purification step in which the overcoated dots are subjected to size selective precipitation to further assure that mainly only the desired quantum dots are present in the final product.

In other embodiments, it may be desirable to modify the core outer surface to permit formation of stable suspensions of the quantum dots. For example, the outer surface of the core may be treated using a surface exchange process carried out using a variety of compounds which are capable of corrdinating or bonding to the outer surface of the quantum dots, such as by way of example, phosphines, thiols, amines, and phosphates. In other embodiments, the quantum dots may be exposed to short chained polymers which exhibit an affinity for the second semiconductor material on one end and which terminate in a moiety having an affinity for the suspension or dispersion medium. Such affinity improves the stability of the suspension and discourages flocculation of the quantum dots.

Figure 4:
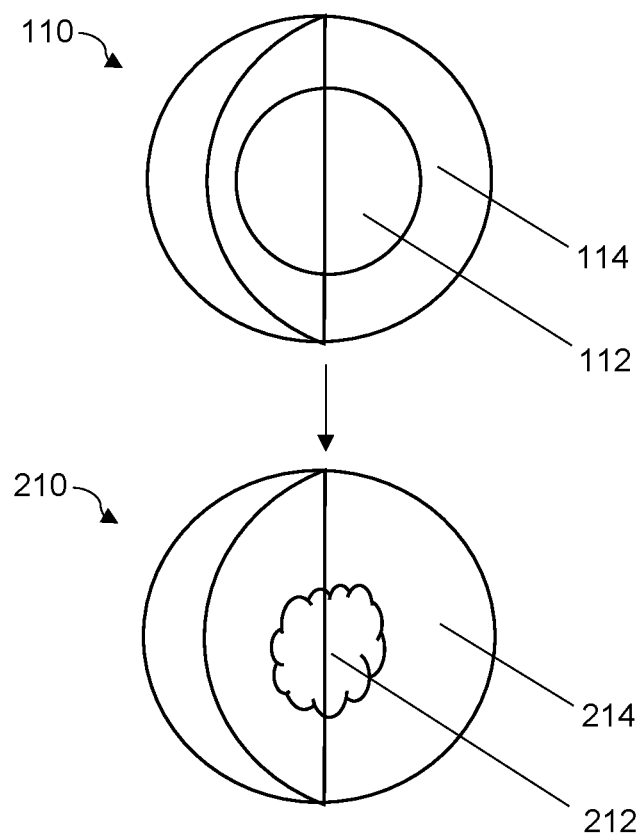
FIG. 4 illustrates an example of the shell of the quantum dot becoming diffused into the core.

FIG. 4 illustrates how controlling the temperature of the collodial phase solution and the time the cores are in the solution causes diffusion of the shell 114 into the core 112. Altering the temperature and the period of time of the overcoating process results in a diffusion of the shell 114 of the quantum dot 110 into the core 112 such that there is a reduction in the size of the core as shown by the diffused shell 214 into the core 212 of quantum dot 210 in FIG. 4. In one embodiment, diffusion causes a core size reduction in the range of about 10 to about 90%, or in another embodiment, in the range of about 25 to about 75%, or in another embodiment, in the range of about 25 to about 50%. The shell 214 is diffused into the core 212 such that the core comprises in the range of about 5% to about 25% of the diameter of the quantum dot 210.

Diffusion of the shell into the core alters the electronic structures of the quantum dots (i.e., changing from a bivalent core to a trivalent core), resulting in a change in the emission. Specifically, quantum dots emit at a specific wavelength based upon the bandgap of the material and their size. This diffusion of the shell into the core results in a change in the electronic structure of the band gap with more energy levels accessible in the conduction band and valence band. This convolution of fluorescence from both the shell bandgap and core bandgap (i.e., more "allowable" transitions) results in a blue-shift in the emission.

Therefore, by controlling the temperature of the collodial phase solution and the time the cores are in the solution, the shape of the emission may be manipulated. For example, diffusion of a PbS/CdS quantum dot leads to broadened emission covering from red to near infrared and repositioning of the peak out between the red and near-infrared.

Figure 5:
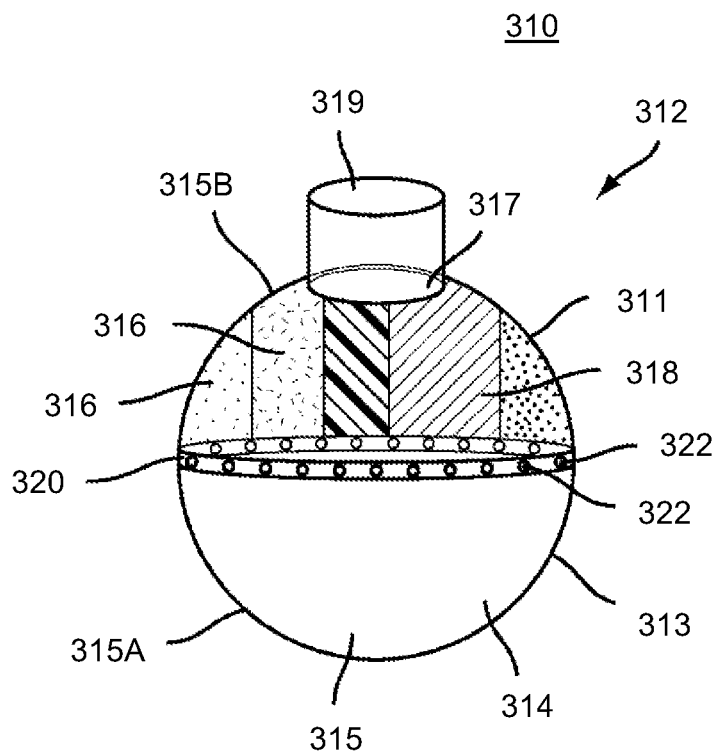
FIG. 5 illustrates an example of a quantum dot based radiation source that may incorporate the quantum dot produced according to the invention.

FIG. 5 illustrates an example of a quantum dot based radiation source that may incorporate the quantum dots of the present invention. Quantum dot based radiation source 310 includes integrating sphere 312. Integrating sphere 312 includes housing 311 having wall 313 forming hollow cavity 314. Inner surface 315 of wall 313 of integrating sphere 312 is coated with radiation diffusion reflective coating, such as SPECTRALON™, or SPECTRAFLECT™ coatings manufactured by Labsphere, Inc. The shape of cavity 314 is commonly spherical, hence the name of "integrating sphere." However, housing 311 defining cavity 314 may have other shapes such as dodecahedron, icosidodecahedron, icosahedron, or the like. In general, an integrating sphere is used for its diffusing effect. Radiation rays incident on any point on the inner surface of the wall of the integrating sphere are distributed equally to all other points by multiple scattering reflections. As a result, the effects of the original direction of such light are minimized. Hence, an integrating sphere may be seen as a diffuser which preserves power but destroys spatial information.

In one embodiment, portion 315A of inner surface 315 of wall 313 (e.g., about one half of inner surface 315 or one hemisphere) is coated with the radiation reflective coating while another portion 315B of inner surface 315 of wall 313 (e.g., the other half of total inner surface 315 or opposite hemisphere) is not coated with the radiation reflective coating. Instead, a plurality of panels 316 coated with quantum dots 318 are provided on portion 315B of inner surface 315 of wall 313.

Quantum dot based radiation source 310 further includes excitation radiation source 320. Excitation radiation source 320 is used to excited quantum dots 318 to emit of photon (one or more photons). In one embodiment, excitation radiation source 320 comprises a plurality of LEDs 322. However, any other type of source may be used. Excitation radiation source 320 (e.g., LEDs 322) is in optical communication with housing 311. In one embodiment, LEDs 322 may be disposed spaced apart around the "equator" of integrating sphere 322. However, LEDs 322 may be arranged in housing 311 of integrating sphere 312 in any desired location and/or configuration. For example, LEDs 322 may be provided at one spot of housing 311. LEDs 322 may be selected according to their radiation power output and/or their spectral output. For example, LEDs 322 may be selected from LEDs that emit in the ultraviolet (UV) spectrum such as UV LEDs made by Phoseon Technology Corporation. Alternatively, the excitation radiation source 320 (e.g., LEDs 322) may be provided remote from housing 311 and optical waveguides (e.g., optical fibers) may be used to guide the radiation emitted by the excitation radiation source 320 to the quantum dots 318.

Radiation emitted by excitation radiation source 320 (e.g., light emitted by LEDs 322) may undergo multiple reflections by the radiation reflective coating on inner surface portion 315A. The reflected excitation radiation is absorbed by quantum dots 318 disposed on substrate panels 316. The quantum dots in turn emit radiation at a wavelength equal or longer than the wavelength of excitation radiation source 320 (e.g., LEDs 322). In other words, excitation radiation source 320 has a wavelength shorter than or equal to the wavelength emitted by quantum dots 318. The radiation emitted by the qauntum dots also undergoes multiple reflections by the radiation reflective coating within the cavity 314.

Exit or output port 317 is provided in wall 313 to allow radiation that is emitted by the qauntum dots and reflected and diffused by the coating on inner surface 315 to exit through exit port 317. Tube 319 may be provided to guide the light output through output port 317.

Upon absorbing a photon, quantum dots 318 may remit a photon (or under certain circumstances multiple photons) at the characteristic wavelength of the quantum dots. The characteristic wavelength of quantum dots 318 may be tuned by selecting materials of the quantum dots 318, forming the quantum dots 318 by thermal processing as discussed above, or by selecting a size of quantum dots 318. Quantum dots 318 act as a frequency downconverter for the radiation emitted by excitation radiation source 320 (e.g., LEDs 322) into specific frequency ranges. Because each quantum dot has a certain defined carrier lifetime, each quantum dot has a defined saturation rate which results in the quantum dot having a defined unit of emitted radiation intensity.

EXAMPLE 1

Figure 6:
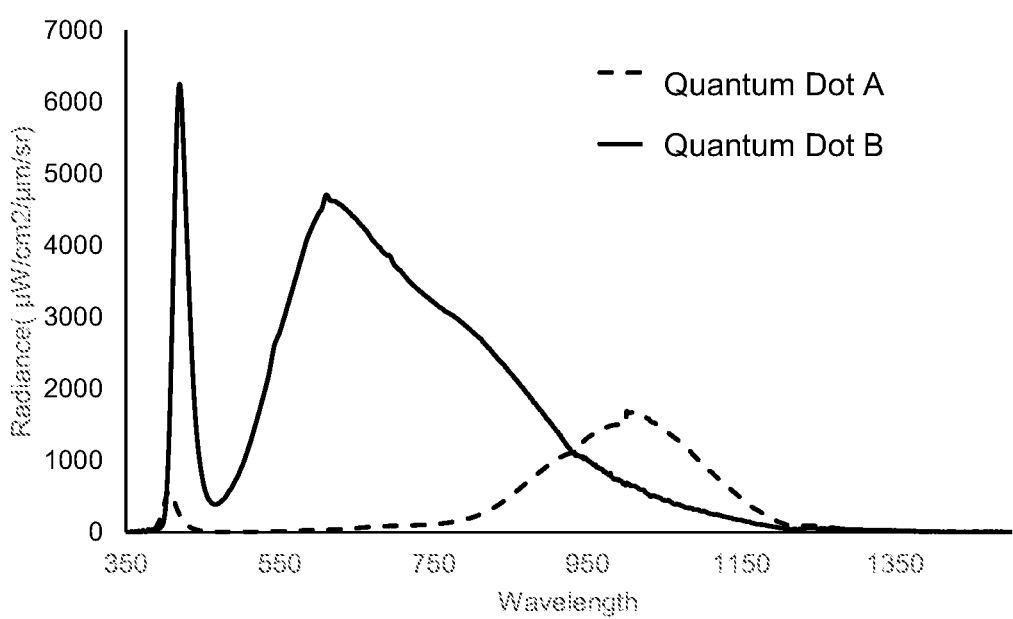
FIG. 6 shows the emission of a conventional quantum dot as compared to a quantum dot prepared as described in Example 1.

A collodial solution of cores in a solvent was mixed within an optically clear epoxy resin until a homogenous color was achieved. The solvent was evaporated from the resin and the crosslinker/activator was added and the epoxy was allowed to cure at room temperature to produce quantum dot A. Another collodial solution was added into a polymer/solvent mixture, which was heated to an elevated temperature of 115° C., the mixture was allowed to cool after a homogenous color within the mixture was acheived. The solvent was evaporated and the dried material was hot pressed to produce quantum dot B. As shown in FIG. 6, quantum dot B, which was processed according to the invention, has a broader emission spectrum than quantum dot A, which was not processed at an elevated temperature for a period of time sufficient to cause diffusion of the shell into the core.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

The invention claimed is:
1. A process for producing quantum dots having a broadened optical emission, the process comprising the steps of:
  forming a plurality of cores comprising a first semiconductor material; and coating each core with a shell comprising a second semiconductor material by introducing a solution containing second semiconductor material precursors in a coordinating solvent into a suspension of the cores, wherein the mixture of the solution containing the second semiconductor material precursors in the coordinating solvent and the suspension of the cores is heated to an elevated temperature and mixed for a period of time sufficient to cause diffusion of the respective shells into the respective cores to form the quantum dots, such that the respective quantum dots have an emission peak in the range of 800 nm to 1,000 nm.

2. The process of claim 1, the step of forming the plurality of cores further comprising:

feeding the first semiconductor material onto a heater element to vaporize the material;

allowing the vaporized material to flow upwardly from the heater element under free convection;

injecting a quenchant gas upwardly from a position below the heater element, parallel to and into contact with the upward flow of the vaporized material and at the same speed as the vaporized material;

allowing the quenchant gas and vaporized material to thermally interact to allow the material to condense out of the vapor to form a plurality of nanoparticles; and annealing the nanoparticles to yield the plurality of cores.

3. The process of claim 1, the first semiconductor material selected from the group consisting of PbS, PbSe, PbTe, and mixtures thereof.

4. The process of claim 1, the second semiconductor material selected from the group consisting of CdS, CdSe, CdTe, and mixtures thereof.

5. The process of claim 1, the mixture of the solution containing the second semiconductor material precursors in the coordinating solvent and the suspension of the cores being heated to a temperature in the range of 135° C. to 220° C.

6. The process of claim 1, the mixture of the solution containing the second semiconductor material precursors in the coordinating solvent and the suspension of the cores being mixed for a period in the range of 1 second to 120 seconds.

7. The process of claim 1, the shell being diffused into the core such that the core has a size reduction in the range of 25% to 50%.

8. The process of claim 1, each quantum dot having a diameter in the range of 1 to 10 nm.

9. A quantum dot having a broadened optical emission obtained by a process comprising the steps of:

forming a plurality of cores comprising a first semiconductor material; and coating each core with a shell comprising a second semiconductor material by introducing a solution containing second semiconductor material precursors in a coordinating solvent into a suspension of the cores, wherein the mixture of the solution containing the second semiconductor material precursors in the coordinating solvent and the suspension of the cores is heated to an elevated temperature and mixed for a period of time sufficient to cause diffusion of the respective shells into the respective cores to form the quantum dots, such that the respective quantum dots have an emission peak in the range of 800 nm to 1,000 nm.

10. The quantum dot of claim 9, the step of forming the plurality of cores further comprising:

feeding the first semiconductor material onto a heater element to vaporize the material;

allowing the vaporized material to flow upwardly from the heater element under free convection;

injecting a quenchant gas upwardly from a position below the heater element, parallel to and into contact with the upward flow of the vaporized material and at the same speed as the vaporized material;

allowing the quenchant gas and vaporized material to thermally interact to allow the material to condense out of the vapor to form a plurality of nanoparticles; and annealing the nanoparticles to yield the plurality of cores.

11. The quantum dot of claim 9, the first semiconductor material selected from the group consisting of PbS, PbSe, PbTe, and mixtures thereof.

12. The quantum dot of claim 9, the second semiconductor material selected from the group consisting of CdS, CdSe, CdTe, and mixtures thereof.

13. The quantum dot of claim 9, the mixture of the solution containing the second semiconductor material precursors in the coordinating solvent and the suspension of the cores being heated to a temperature in the range of 135° C. to 220° C.

14. The quantum dot of claim 9, the mixture of the solution containing the second semiconductor material precursors in the coordinating solvent and the suspension of the cores being mixed for a period in the range of 1 second to 120 seconds.

15. The quantum dot of claim 9, the shell being diffused into the core such that the core has a size reduction in the range of 25% to 50%.

16. The quantum dot of claim 9, the quantum dot having a diameter in the range of 1 to 10 nm.

17. A process for producing quantum dots having a broadened optical emission, the process comprising the steps of:

forming a plurality of cores comprising a first semiconductor material; and coating each core with a shell comprising a second semiconductor material by introducing a solution containing second semiconductor material precursors in a coordinating solvent into a suspension of the cores, wherein the mixture of the solution containing the second semiconductor material precursors in the coordinating solvent and the suspension of the cores is heated to an elevated temperature and mixed for a period of time sufficient to cause diffusion of the respective shells into the respective cores to form the quantum dots;

wherein the first semiconductor material of the cores is PbS and the second semiconductor material of the shells is CdS; or wherein the first semiconductor material of the cores is CdSeTe and the second semiconductor material of the shells is ZnS.

18. The process of claim 17, wherein the first semiconductor material of the cores is PbS and the second semiconductor material of the shells is CdS, and wherein the quantum dots have an emission peak in the range of 900 nm to 1,000 nm.

19. The process of claim 17, wherein the first semiconductor material of the cores is CdSeTe and the second semiconductor material of the shells is ZnS, and wherein the quantum dots have an emission peak in the range of 800 nm to 880 nm.

20. The process of claim 17, wherein the the mixture of the solution containing the second semiconductor material precursors in the coordinating solvent and the suspension of the cores is heated to a temperature in the range of 135° C. to 220° C.; and wherein the mixture of the solution containing the second semiconductor material precursors in the coordinating solvent and the suspension of the cores are mixed for a period in the range of 1 second to 120 seconds.

* * * * *